US011487094B2

(12) United States Patent
Ronzitti et al.

(10) Patent No.: US 11,487,094 B2
(45) Date of Patent: Nov. 1, 2022

(54) OPTICAL SYSTEM FOR SPATIOTEMPORAL SHAPING THE WAVEFRONT OF THE ELECTRIC FIELD OF AN INPUT LIGHT BEAM TO CREATE THREE-DIMENSIONAL ILLUMINATION

(71) Applicants: UNIVERSITE PARIS DESCARTES, Paris (FR); CENTRE NATIONAL DE LA RECHERCHE SCIENTIFIQUE, Paris (FR); INSTITUT NATIONAL DE LA SANTE ET DE LA RECHERCHE MEDICALE, Paris (FR)

(72) Inventors: Emiliano Ronzitti, Paris (FR); Nicolò Accanto, Paris (FR); Valentina Emiliani, Paris (FR); Eirini Papagiakoumou, Antony (FR); Dimitrii Tanese, Paris (FR)

(73) Assignees: UNIVERSITE PARIS DESCARTES, Paris (FR); CENTRE NATIONAL DE LA RECHERCHE SCIENTIFIQUE, Paris (FR); INSTITUT NATIONAL DE LA SANTE ET DE LA RECHERCHE MEDICALE, Paris (FR)

( * ) Notice: Subject to any disclaimer, the term of this patent is extended or adjusted under 35 U.S.C. 154(b) by 226 days.

(21) Appl. No.: 16/603,216

(22) PCT Filed: Apr. 6, 2018

(86) PCT No.: PCT/EP2018/058925
§ 371 (c)(1),
(2) Date: Oct. 4, 2019

(87) PCT Pub. No.: WO2018/185323
PCT Pub. Date: Oct. 11, 2018

(65) Prior Publication Data
US 2021/0080709 A1 Mar. 18, 2021

(30) Foreign Application Priority Data

Apr. 7, 2017 (EP) .................................. 17165572

(51) Int. Cl.
*G02B 21/06* (2006.01)
*G02B 5/32* (2006.01)
(Continued)

(52) U.S. Cl.
CPC ............... *G02B 21/06* (2013.01); *G02B 5/32* (2013.01); *G02B 27/106* (2013.01); *G03F 7/70* (2013.01)

(58) Field of Classification Search
CPC ........ G02B 21/06; G02B 5/32; G02B 27/106; G03F 7/70
(Continued)

(56) References Cited

FOREIGN PATENT DOCUMENTS

| DE | 102014200633 B3 | 5/2015 |
| EP | 3096171 A1 | 11/2016 |
| WO | 2016146279 A1 | 9/2016 |

OTHER PUBLICATIONS

International Search Report issued in connection with PCT/EP2018/058925 dated Oct. 11, 2018.
(Continued)

*Primary Examiner* — Collin X Beatty
(74) *Attorney, Agent, or Firm* — Steven M. Shape

(57) ABSTRACT

The present invention concerns an optical system for spatiotemporally shaping the wavefront of the electric field of a light beam (1) to be projected into a target volume (5), where the propagation axis is axis z, to create 3D patterned illumination in the target volume (5), comprising a pulsed laser source, configured to have an illumination pattern whose transversal surface at the target volume being superior to the diffraction limit of the optical system, at least one
(Continued)

intermediate optical element (4) which is a dispersive grating for performing temporal focusing of the light beam (1), located, on the propagation axis (z), where an image of the illumination pattern is formed, for modulating the phase and/or the amplitude of the electric field of the light beam, and a second optical element (3) which is a spatiallight modulator for modulating the phase of the electric field of the input light beam, and for realizing spatiotemporal multiplexing to create 3D patterned illumination in the target volume (5) by replicating the illumination pattern, so as to have several replicated illumination patterns in the target volume (5), and controlling the position with transversal coordinates X, Y and axial coordinate Z of each replicated illumination pattern in the target volume (5).

17 Claims, 7 Drawing Sheets

(51) Int. Cl.
    *G02B 27/10*     (2006.01)
    *G03F 7/20*     (2006.01)

(58) Field of Classification Search
    USPC .......................................................... 359/9
    See application file for complete search history.

(56)            References Cited

OTHER PUBLICATIONS

Written Opinion of the International Searching Authority issued in connection with PCT/EP2018/058925 dated Oct. 11, 2018.

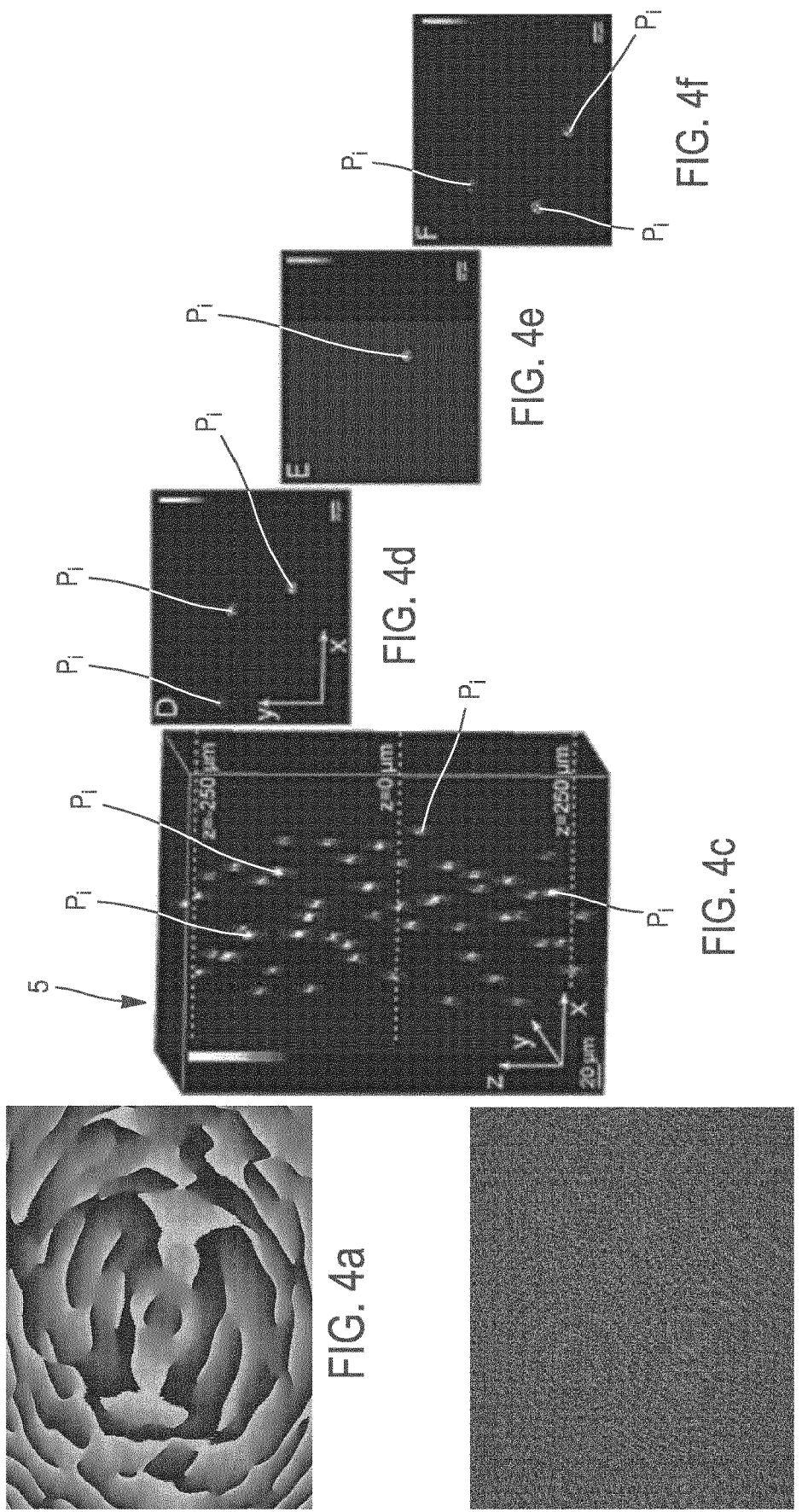

OPTICAL SYSTEM FOR SPATIOTEMPORAL SHAPING THE WAVEFRONT OF THE ELECTRIC FIELD OF AN INPUT LIGHT BEAM TO CREATE THREE-DIMENSIONAL ILLUMINATION

CROSS-REFERENCE TO RELATED APPLICATIONS

This is a 35 U.S.C. 371 National Stage Patent Application of International Application No. PCT/EP2018/058925, filed Apr. 6, 2018, which claims priority to European application 17165572.3, filed Apr. 7, 2017, each of which is hereby incorporated by reference in its entirety.

FIELD OF THE INVENTION

The invention concerns spatio-temporal wavefront shaping of optical beams.

STATE OF ART

Wavefront shaping is having a strong impact in many diverse research fields of microscopy including structural and functional imaging, neuronal photostimulation and lithography.

Original configurations for two-photon (2P) microscopy were based on laser scanning approaches, where a tightly focused pulsed beam is scanned across a defined sample region with the use of galvanometric mirrors or acousto-optical deflectors (AODs). Today, the need of monitoring large volumes with high spatiotemporal resolution has prompted the developments of new optical schemes. These include random access scanning with AODs, fast scanning with resonant scanners or spatiotemporal beam multiplexing. These configurations coupled to fast axial scanning enable quick probing of large three-dimensional (3D) volumes.

Few years ago, temporal focusing (TF) was proposed as an elegant scan-less solution to simultaneously illuminate large areas with micrometer axial confinement. In this configuration, a dispersive grating placed at a plane conjugated with the sample plane, diffracts the different spectral frequencies comprising the ultra-short excitation pulse toward different directions. The various frequencies thus propagate toward the objective focal plane at different angles, such that the pulse is temporally smeared away from the focal plane, which remains the only region irradiated at peak powers efficient for 2P excitation. TF has found applications in imaging, super resolution imaging, lithography and, combined with scanning approaches, has permitted efficient optogenetic photostimulation in vitro and in vivo.

Many applications, such as lithography, uncaging, optogenetics or fast functional imaging, require generation of 2P illumination patterns on user-defined regions of interest. This was achieved by combining TF with spatial wavefront-shaping approaches, such as computer-generated holography (CGH) or generalized phase contrast. In both cases, illumination shapes (=targets=patterns) based on the sample morphology were generated with micrometer axial and lateral precision, and remarkable robustness to scattering that enabled efficient neuronal stimulation with 2P optogenetics.

The next challenging breakthrough for 2P microscopy is to enable generation of shaped illumination targets across 3D volumes while preserving micrometer lateral and axial precision.

The ability to precisely control the three-dimensional (3D) distribution of the illumination is critical for all those applications involving spatially-controlled light-matter interaction, e.g. 3D lithography, 3D photopolymerization, imaging, or 3D optical data storage.

The combination of CGH-based 3D extended patterns with temporal focusing, critical for achieving high axial confinement and preserving the excitation patterns in scattering tissues, have been recently explored. Albeit in general the temporal focus plane can be axially displaced by introducing group velocity dispersion, this strategy is hindered in CGH due to the presence of CGH-induced intensity speckles. Axial displacements of extended TF-CGH patterns can be obtained by adopting on-axis-light propagation optical designs where TF is enabled by means of a dual-prism grating disposed in transmission geometry. However, that allows exclusively the axial shifts of a single spatiotemporal focus plane and, for high-numerical aperture (NA) objectives, is limited to about 30-μm axial displacements with major limitations in terms of displacement velocity.

To project temporally focused extended patterns on multiple planes, Hernandez et al. proposed to independently control the lateral and axial position of the patterns using two spatial light modulators (SLMs), described in the PCT application WO2016/146279. The first SLM is used to control the lateral distribution of light (similarly to regular CGH), while the second SLM, conjugated to the first SLM and placed after the diffraction grating for TF, applies a specific spherical phase profile (lens effect) for axial displacement of the pattern at a given plane. Independent generation of light pattern across n different axial planes can be here achieved by dividing the SLMs displays to n-independently addressed tiles. However, tiling the SLMs sets a practical upper limit for the maximum number of planes that can be addressed (about 6 planes).

DRAWINGS

Other features, embodiments, aim and advantages of the invention will be pointed out in the following specification, which is illustrative and non-limitative, that shall be read in view of the drawings, on which:

FIGS. 1 and 2 show two embodiments of the optical system;

FIG. 3 shows the principle of the invention; an initial illumination pattern can be created as in this example, with a phase modulation technique, such as CGH, according to a phase profile that generates a round spot; this is the phase of the first optical element; the second optical element is addressed in our example with a phase profile that creates 4 diffraction-limited spots in different lateral locations; the combination of the two phase-profiles results in a convolution at the sample volume of the initial illumination pattern intensity with the intensity of the 3D diffraction-limited spots generated by the phase modulation of the light beam on the second optical element. The resulted intensity generates replicated patterns in the target volume, in the position of the diffraction-limited spots;

FIGS. 4a and 4b represent an example of the phase mask addressed to the first SLM (FIG. 4a), for generating a round spot of 15-μm diameter at the focal plane of the objective, and to the second SLM (FIG. 4b) for replicating this spot in 50 different locations of the target volume 5, according to the embodiment of the optical system presented in FIG. 1;

FIG. 4c represents the experimental volumetric reconstruction of the three-dimensional arrangement of the illumination patterns; the bright spots represent the fluorescence emitted by the rhodamine sample after 2P excitation by the illumination patterns;

FIGS. 4d, 4e, 4f represent individual x-y images of the replicated spots at different axial planes: z=−250 µm, z=0 µm and z=250 µm, respectively;

Figure 5A:
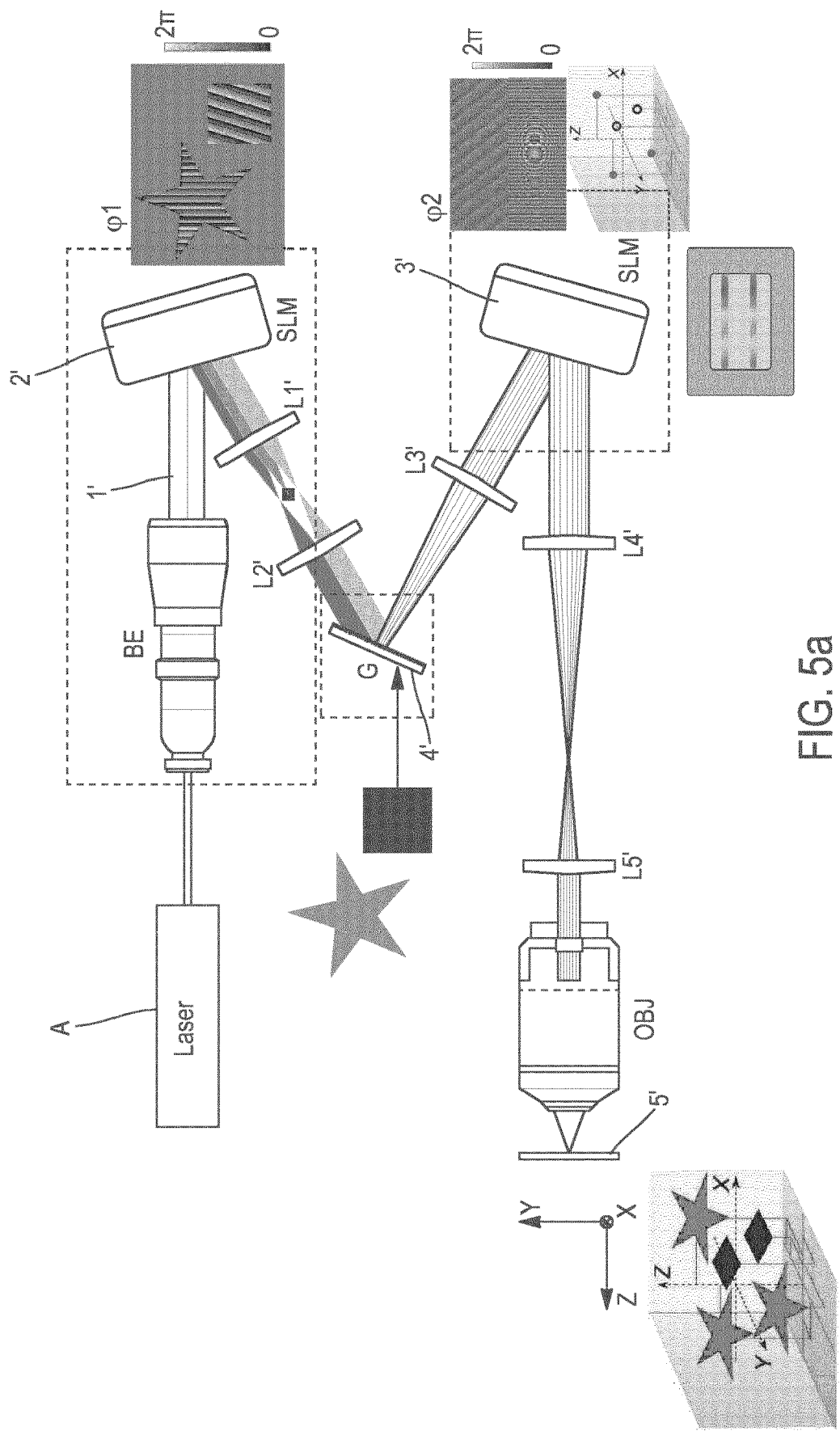

FIG. 5a shows an embodiment of the optical system, in which the first optical element SLM 2' is addressed such as to perform amplitude and phase modulation; An example is shown where the original pattern P is composed of two different shapes, a star and a square, each encoded with a different phase grating, such as to be projected in a different lateral position (upper-dark grey beam for the star, lower-light grey beam for the square, and middle grey beam corresponds to zero order beam, i.e. light that is not diffracted by the first optical element SLM 2', and it is physically blocked) on the intermediate optical element 4' (grating for performing TF); The second optical element, SLM 3', can be addressed in second sub-regions (here two sub-regions, one for addressing light arising from the star (top) and the other from the square (bottom)) for projecting replicas of each shape of the original pattern in different 3D positions at the sample volume 5'; in the specific example presented here solid points represent the positions where stars will project at the sample volume 5', and hollow points the positions where squares will project; thus, at the sample volume 5', stars and squares are 2D light distributions (X,Y) whose focal plane lies in different Z positions; Please note, the orientation of the axes in the cartoon showing the shapes at the sample volume 5' is indicative and is rotated in relation to the optical axis of the optical system shown for better illustration of the patterns.

Figure 5B:
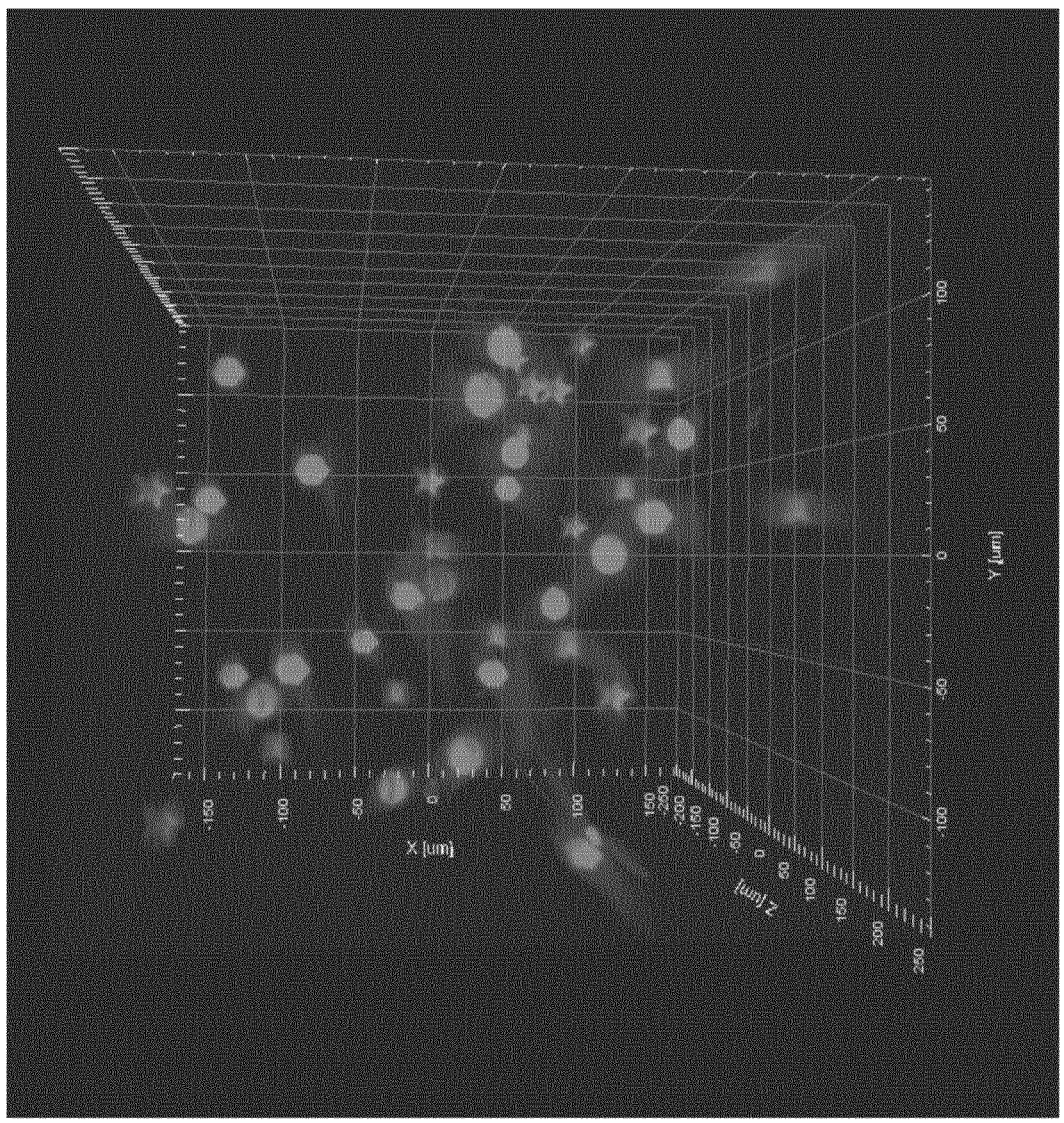
Figure 5C:
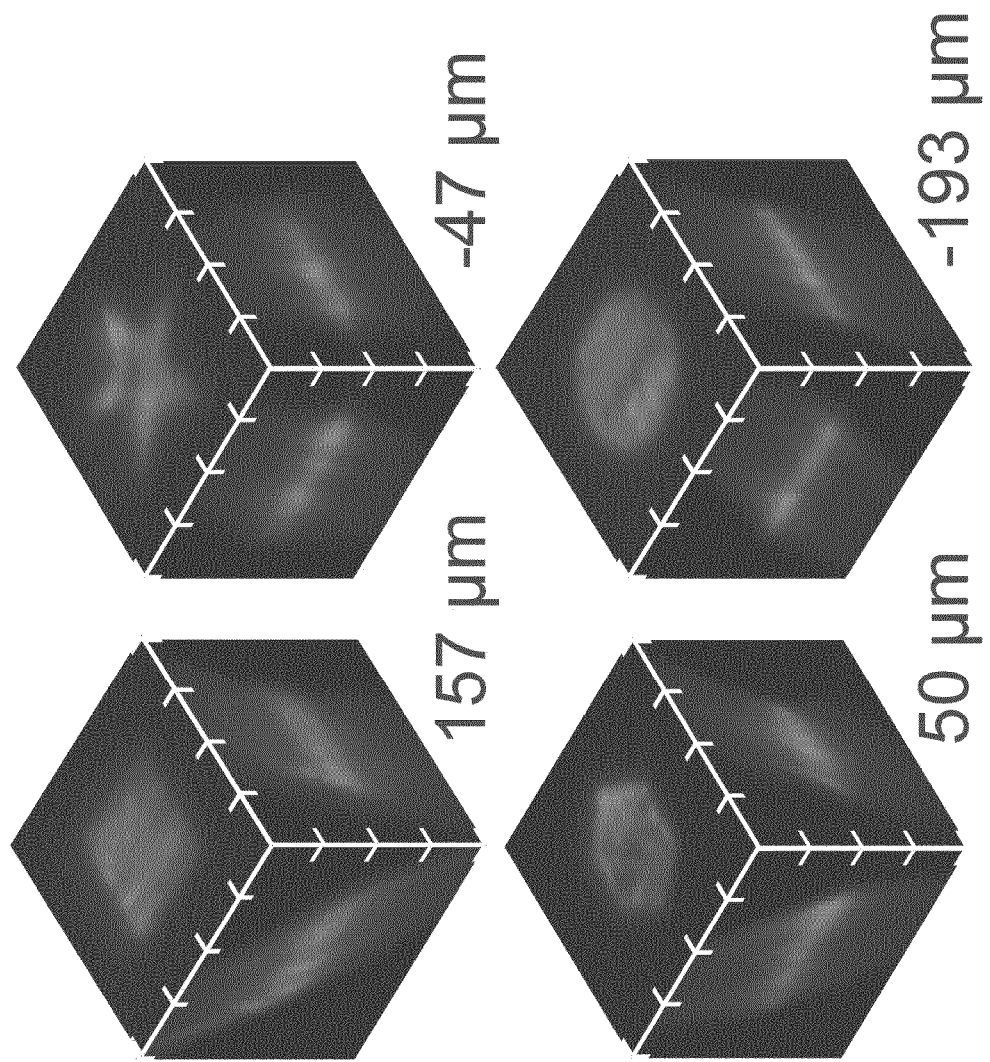
Figure 6:
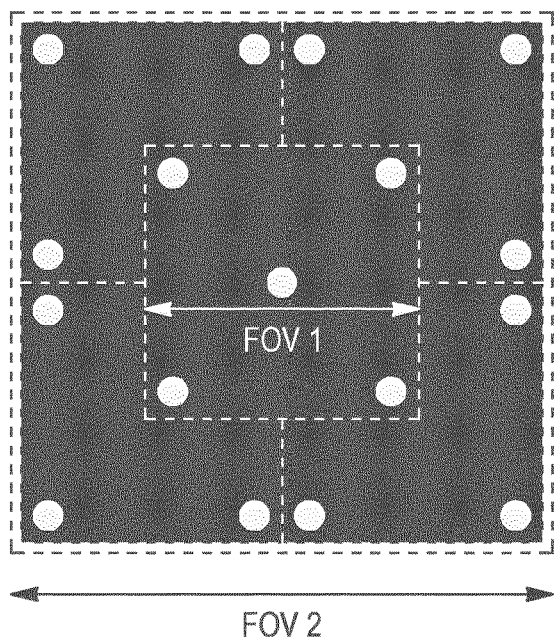
Figure 7A:
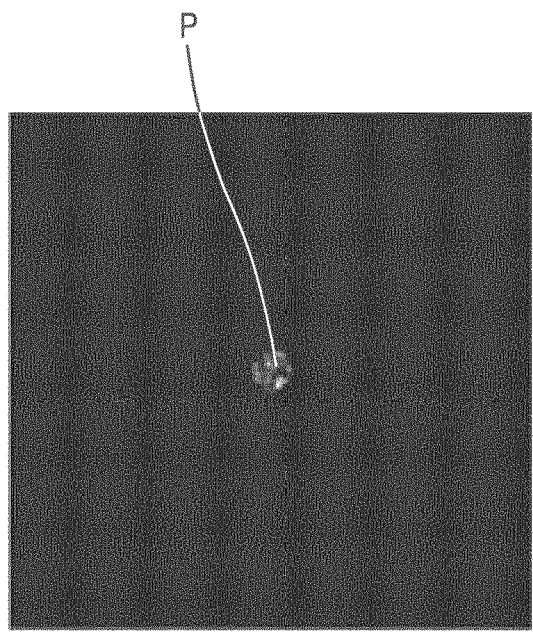
Figure 7B:
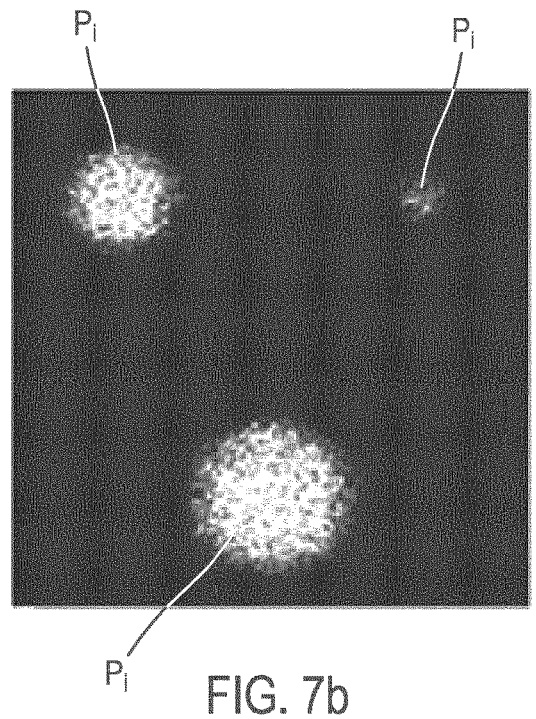

FIGS. 5b and 5c show an experimental demonstration of the embodiment shown in FIG. 5a, where the original pattern P consists from 4 different shapes (a square, a star, a hexagon and a circle); here we show the sample volume 5', where we project replicas of the 4 different shapes (FIG. 5b) and a zoomed-in example from each shape, at different z-positions;

FIG. 6 shows a schematic of the increase of the transversal size of the accessible target volume, or lateral field of view (FOV) using the second SLM; the extension of the region achievable by light patterning with the initial beam shaper 1 (FOV1) is extended by the second SLM, allowing to generate illumination patterns on a larger FOV (FOV2), FIGS. 7a and 7b show a simulation of the size-control of the illumination patterns; an illumination pattern (here a round CGH-spot) generated by the beam shaper 1 (FIG. 7a) is replicated, in three different locations, into patterns of size equal, double or triple of the initial pattern shown in FIG. 7a, by multiplexing and expanding this initial pattern, with the second SLM 3.

GENERAL DESCRIPTION OF THE OPTICAL DEVICE OF THE INVENTION

The optical system for spatiotemporally shaping the wavefront of the electric field of a light beam 1 to be projected into a target volume 5, where the propagation axis is axis z, to create 3D patterned illumination in the target volume 5.

This optical system comprises:
(i) a light-emitting coherent pulsed source A, (for instance pulsed laser source), coupled to a beam shaper (for instance a beam expander, a phase mask, a SLM), configured to give one illumination pattern P (called "initial illumination pattern"), whose transversal surface at the target volume is superior to the diffraction limit of the optical system (e.g. creating a large Gaussian beam of lateral size bigger than the diffraction-limit of the optical system), (ii) one or several intermediate optical elements 4, 4' the one or at least one of the intermediate optical elements being a dispersive grating for performing temporal focusing of the light beam 1, 1' located on the propagation axis z, where an image of the initial illumination pattern is formed (iii) and a second optical element 3, 3' which is a spatial light modulator for modulating the phase of the electric field of the input light beam, and for realizing spatiotemporal multiplexing to create 3D patterned illumination in the target volume 5, 5'.

The initial illumination pattern P can have one or several regions of illumination in a transversal plane (transversal to the propagation axis z) of the same or different shape and size, and the initial illumination pattern P can be:—fixed (static), e.g. when it is generated with a static optical element, or —dynamic e.g. when it is generated with a reconfigurable element (e.g. a SLM, a DMD)

The second optical element:
replicates the initial illumination pattern (P), so as to have several replicated illumination patterns ($P_i$) in the target volume 5, 5', each of the replicated illumination patterns ($P_i$) having a size at least equal to the size of the initial illumination pattern P, and
controls the position of each replicated illumination pattern ($P_i$), given by the transversal coordinates $X_i$, $Y_i$ and axial coordinate $Z_i$ in the target volume 5, 5'
the coordinates $X_i$, $Y_i$ and $Z_i$ being chosen independently from each other,
the second optical element 3, 3' being situated on the propagation axis z at the Fourier plane of a lens placed after the at least one intermediate optical element 4, 4' on the trajectory of the light beam 1, 1'.

The word 'transversal' or 'lateral' means a direction perpendicular to the propagation axis z (or optical axis).

The coordinates $X_i$, $Y_i$, $Z_i$ are for instance the coordinates of the center (or a given pixel) of the replicated illumination pattern ($P_i$).

Thus, each replicated illumination pattern ($P_i$) occupies a volume position whose coordinates are independent of the other coordinates of volume positions of the other replicated illumination patterns ($P_i$).

The optical system comprises as beam shaper, a first optical element 2, 2' used to control light distribution, through phase and/or amplitude modulation of the electric field of the light beam, situated before the intermediate optical element 4, 4' and after the light emitting source (A) on the trajectory of the light beam 1, 1'.

The first optical element 2 generates one initial two-dimensional illumination pattern, described by a function $f(x,y,z=0)$, the initial illumination pattern P being imaged onto at least one intermediate optical element 4, and then replicated N times by the second optical element 2 in the target volume 5, at arbitrary positions of coordinates $\Delta X_i$, $\Delta Y_i$, $\Delta Z_i$ such that the resulting illumination pattern which is composed by the replicated illumination patterns $P_i$ is given by a function $F(X,Y,Z)=\sum_{i=1}^{N} f(M \cdot x + \Delta X_i, M \cdot y + \Delta Y_i, \Delta Z_i)$, with M the magnification factor between the plane of the intermediate optical element 4 and the target volume 5.

The second optical element 3, 3' can be addressed with a phase modulation profile encoding an intensity of 3D diffraction-limited spots, which convoluted with the intensity of the initial illumination pattern P at the target volume 5, 5' results in multiple replicated illumination patterns of the initial pattern P, and/or of patterns of larger size or different shape, resulting from the spatial superpositions of the multiple replicated illumination patterns $P_i$.

The coordinates x, y, z are for instance the coordinates of the center (or a given pixel) of the initial illumination pattern (P) imaged on the intermediate optical element (DMD, or Grating for instance) 4, 4'.

And the coordinates of the replicated illumination pattern $(P_i)$ are given by:

$$X_i = M \cdot x + \Delta X_i$$

$$Y_i = M \cdot y + \Delta Y_i$$

$$Z_i = \Delta Z_i.$$

The second optical element 3, 3' is addressed with a phase function (illustrated on FIG. 4b) that reproduces a grating or prism effect for obtaining the transversal coordinates $X_i, Y_i$ of the replicated illumination pattern $P_i$ in the target volume 5, 5', and a lens effect (e.g. Fresnel lens) for obtaining the axial coordinate $Z_i$ of the replicated illumination pattern $P_i$.

The second optical element 3 is located at a back focal plane of a third lens L3, which, together with a fourth lens L4, form a telescope to image the plane of the second optical element 3 at the back focal plane of an objective lens.

The optical system can comprise a GRIN (graded index) lens after the objective lens.

The system can be implemented on different embodiments (variants), consisting of different approaches to generate the initial beam shaping (different beam shaper) of the beam 1.

Figure 1:
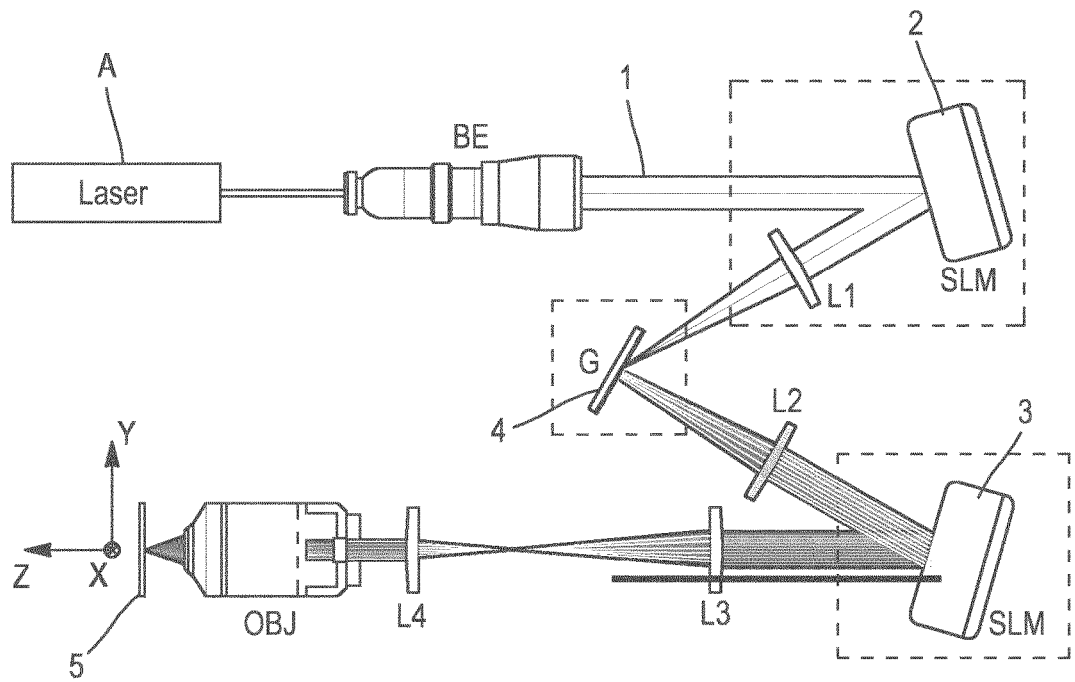

In a first embodiment illustrated on FIG. 1, the beam shaper comprises a first optical element 2, which is a spatial light modulator (SLM) for creating an illumination pattern with computer-generated holography.

For instance, the computer-generated holographic pattern is a speckle-free pattern.

The dynamic phase profile addressing the first SLM 2 (FIG. 4a) and the dynamic phase profile addressing the second SLM 3 (FIG. 4b) are chosen independently, as represented on FIG. 4a and on FIG. 4b.

In a second variant (not shown on drawings) of the first embodiment, the beam shaper comprises a first optical element 2, which is a SLM for creating an illumination pattern with the generalized phase contrast method.

Figure 2:
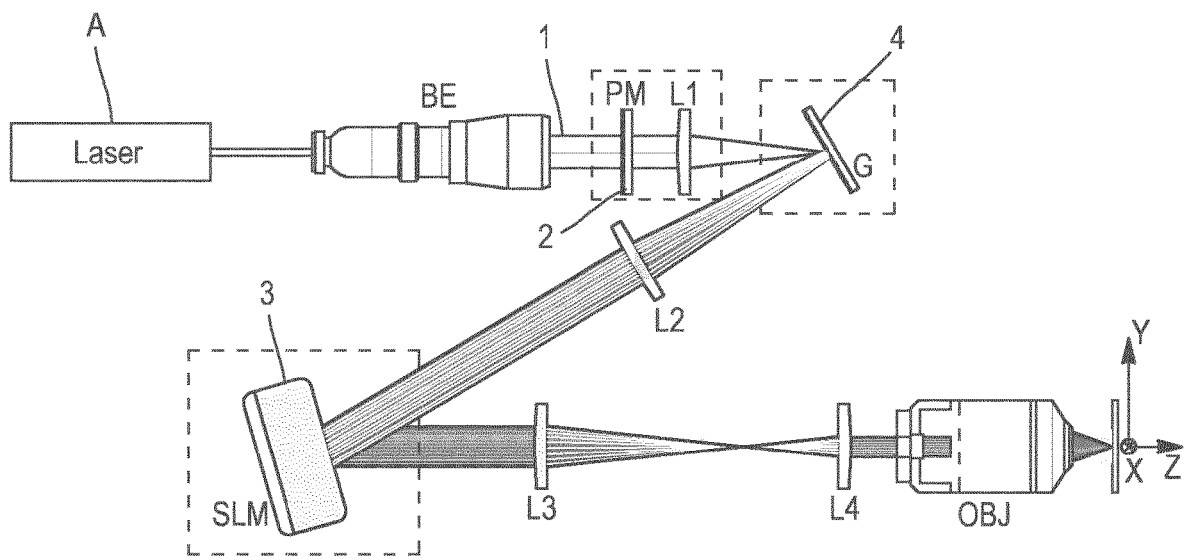

In a second embodiment illustrated on FIG. 2, the beam shaper comprises a first optical element 2, which is a static phase mask (which has a fixed phase).

In others embodiments, the first optical element is a static, or dynamically reconfigurable, amplitude-phase mask encoding several (n) illumination regions (P) for the initial illumination pattern (P), with different grating or prism phase effects, one grating or prism phase effect per region, for projecting the regions in different lateral (x,y) positions perpendicular to the propagation axis z, at an intermediate plane.

For instance, the first optical element can be a SLM or a DMD+static phase mask.

Advantageously, in the embodiments described above, the second optical element 3, 3' is configured to increase the size of the replicated illumination patterns $P_i$ in the target volume 5, 5' the size of each replicated illumination pattern $P_i$ being increased independently of the other replicated illumination patterns $P_i$.

Advantageously, the second optical element 3, 3' can be configured so that the resulting pattern at the target volume 5, 5' is composed of multiple replicated illumination patterns $P_i$ of the initial pattern P, and/or of patterns of larger size or different shape, resulting from the spatial superpositions of the multiple replicated illumination patterns $P_i$.

Advantageously, the second optical element 3, 3' is configured to increase the field of view size of the transversal coordinates $(X_{FOV}, Y_{FOV})$ of the first SLM 2, 2' in the target volume 5, 5'.

Advantageously, the second optical element 3, 3' is configured to shape the light beam 1, 1' in the spectral domain, to correct for the intrinsic wavelength dependence of the SLMs, to produce dedicated holograms for different wavelengths, or to create different targets at different spatial locations in the target volume 5 characterized by different temporal shapes of the laser pulse.

In some variants not shown, the optical system comprises at least two intermediate optical elements 4, 4' the first intermediate optical element being a digital micromirror device (DMD) for fast modification of the illumination pattern and the second intermediate optical element being a dispersive grating for temporal focusing.

In a variant of the system shown in FIG. 5, a combination of amplitude and phase modulation in the beam shaper allows to generate an initial pattern P, containing several (n) illumination regions ($P^j$) of different sizes and shapes, and each of these regions can be replicated on different independent locations in the target volume 5' by the second SLM 3'. The second SLM 3' is configured in second sub-regions, each second sub-region addressing light arising from one single first sub-region of the initial illumination pattern (P) of the beam shaper described by a function $f(x,y,z=0)$, to perform phase modulation such as to replicate the shape of each first sub-region $N^j$ times to have $N^j$ replicated illumination patterns ($P_i^j$) in the target volume 5', at positions of coordinates $\Delta X_i^j, \Delta Y_i^j, \Delta Z_i^j$. The resulting illumination pattern, which is composed by the $N^j$ replicated illumination patterns ($P_i^j$) is given by a function $F(X,Y,Z) = \Sigma_{j=1}^{n} \Sigma_{i=1}^{N^j} f_j(M \cdot x_j + \Delta X_i^j, M \cdot y_j + \Delta Y_i^j, \Delta Z_i^j)$, with M the magnification factor between the plane of the intermediate optical element 4' and the target volume 5', where $f = f_1 + f_2 + \ldots + f_j$.

In another embodiment not shown on drawings, the optical system does not comprise a first optical element and comprises:

(i)—only a light emitting coherent pulsed source A: for instance, a pulsed laser, or a pulsed laser with a beam expander, configured to give one initial illumination pattern (P) whose transversal surface in the target volume being superior to the diffraction limit of the optical system, (ii)—at least one intermediate optical element 4, 4' which is a dispersive grating for performing temporal focusing of the light beam 1, located, on the propagation axis (z), where an image of the illumination pattern P is formed.

(iii)—and a second optical element 3, 3' which is a spatial light modulator for modulating the phase of the electric field of the input light beam, and for realizing spatiotemporal multiplexing to create 3D patterned illumination in the target volume 5 by:

replicating the initial illumination pattern P, so as to have several replicated illumination patterns $P_i$ in the target volume 5, 5' each of the replicated illumination patterns $P_i$ having a size at least equal to the size of the illumination pattern P, and controls the position of each replicated illumination pattern ($P_i$), given by the transversal coordinates $X_i, Y_i$ and axial coordinate $Z_i$, in the target volume 5, 5'.

In this embodiment, the pulsed laser source is used eventually with a beam expander, for projecting a Gaussian beam directly on the intermediate optical element 2, 2' and an extra optical element for increasing the size of the beam on the second optical element 3, 3' (e.g. an optical element adding defocus).

Advantageously, the group velocity dispersion of the pulsed laser source can be controlled to coincide the temporal foci with the respective spatial foci in the sample volume, in other terms to coincide the temporal focus with the respective spatial focus in the sample volume 5, 5' for every replicated pattern $P_i$.

The optical system can be used for applications in cell photostimulation (e.g. neuronal photostimulation with optogenetics or photolysis), ablation, photoconversion, stimulation of photoactivatable proteins and morphological or functional imaging (e.g. with calcium or voltage sensors), photopolymerization, optical data storage and photolithography.

DETAILED DESCRIPTION OF PREFERRED EMBODIMENTS

We demonstrate a novel optical system that generates a theoretically unlimited number of extended illumination targets, simultaneously projected and arbitrarily arranged in three dimensions, with an axial resolution completely decoupled from the lateral size. The scheme comprises:
- one beam shaper, for instance a spatial light modulator (SLM) 2, to create the desired two-dimensional shape, e.g. by using computer generated holography, generalized phase contrast, or amplitude modulation;
- a diffraction grating, placed after the beam shaper to perform temporal focusing;
- a second SLM 3, 3' placed after the grating that multiplies the original shape, thus obtaining various identical replicated illumination patterns $P_i$ arranged in three-dimensions at the sample position. The number of available replicated illumination patterns $P_i$ is only limited by the number of illuminated pixels at the second SLM, which, compared to previous techniques, provides an increase of at least one order of magnitude in the number of different planes that can be simultaneously addressed at the sample position.

Remarkably, by addressing the second SLM 3, 3' with holograms for extended shapes, it is also possible to tune the size of the original shape and to produce different targets with different shapes at different spatial locations at the sample position.

Finally, separating the different spectral frequencies with the grating for temporal focusing before the second SLM 3, 3' in this arrangement gives the unique possibility to simultaneously shape the beam in space and spectral domain (time). This, for instance, can be used to correct for the intrinsic wavelength dependence of the SLMs, to produce dedicated holograms for different wavelengths, to create different targets at different spatial locations characterized by different temporal shapes of the laser pulse.

The invention consists in an optical system capable of spatio-temporally shaping the electric field of a laser beam to create 3D patterned illumination in a target volume optically confined both on the transversal (x-y) and longitudinal (z) axis.

DESCRIPTION

The system, represented in FIG. 1, is based on 3 main elements: a beam shaper, consisting of a set of optical elements performing an initial spatial modulation of the input laser beam; a diffraction grating 4 enabling temporal focusing of the pattern generated by the beam shaper, and a reconfigurable spatial light modulator SLM 3, 3', which replicates by phase modulation the temporally focused pattern created by the beam shaper and the grating 4 over multiple 3D locations at the target volume.

The beam shaper has the role to perform a spatial shaping of the input laser beam in the x-y transversal plane before imaging it on the grating 4. The imposed shape can be either fixed (static) or dynamically-controlled via reconfigurable optical elements (e.g. digital micromirror device; DMD, liquid-crystal based spatial light modulator; LC-SLM, etc.) and can be generated with a variety of approaches, based on phase and/or amplitude modulation of the input laser's electric field.

Here we report few possible configurations:

Variant A: Gaussian Beam

The output of the beam shaper is a collimated Gaussian beam of a given waist, such as this Gaussian beam at the target volume creates a Gaussian-form illumination of a waist bigger than the diffraction-limit of the optical system. Light from the pulsed laser source is expanded, if needed, and sent to the grating 4. Light from the pulsed laser source can be also aberrated, e.g. with a spherical lens introducing defocusing, such as illumination at the second optical element 3, 3' covers the active area of the second optical element 3, 3'. Creation of a secondary spatial focus for each replicated pattern $P_i$ at the sample volume 5 due to defocusing in this case, can be treated by shifting the primary temporal focus by introducing group velocity dispersion in the light from the pulsed laser source, to coincide it with the secondary spatial focus. In this way, temporal and spatial focus are jointly replicated, cancelling the existence of two separate foci.

Figure 3:
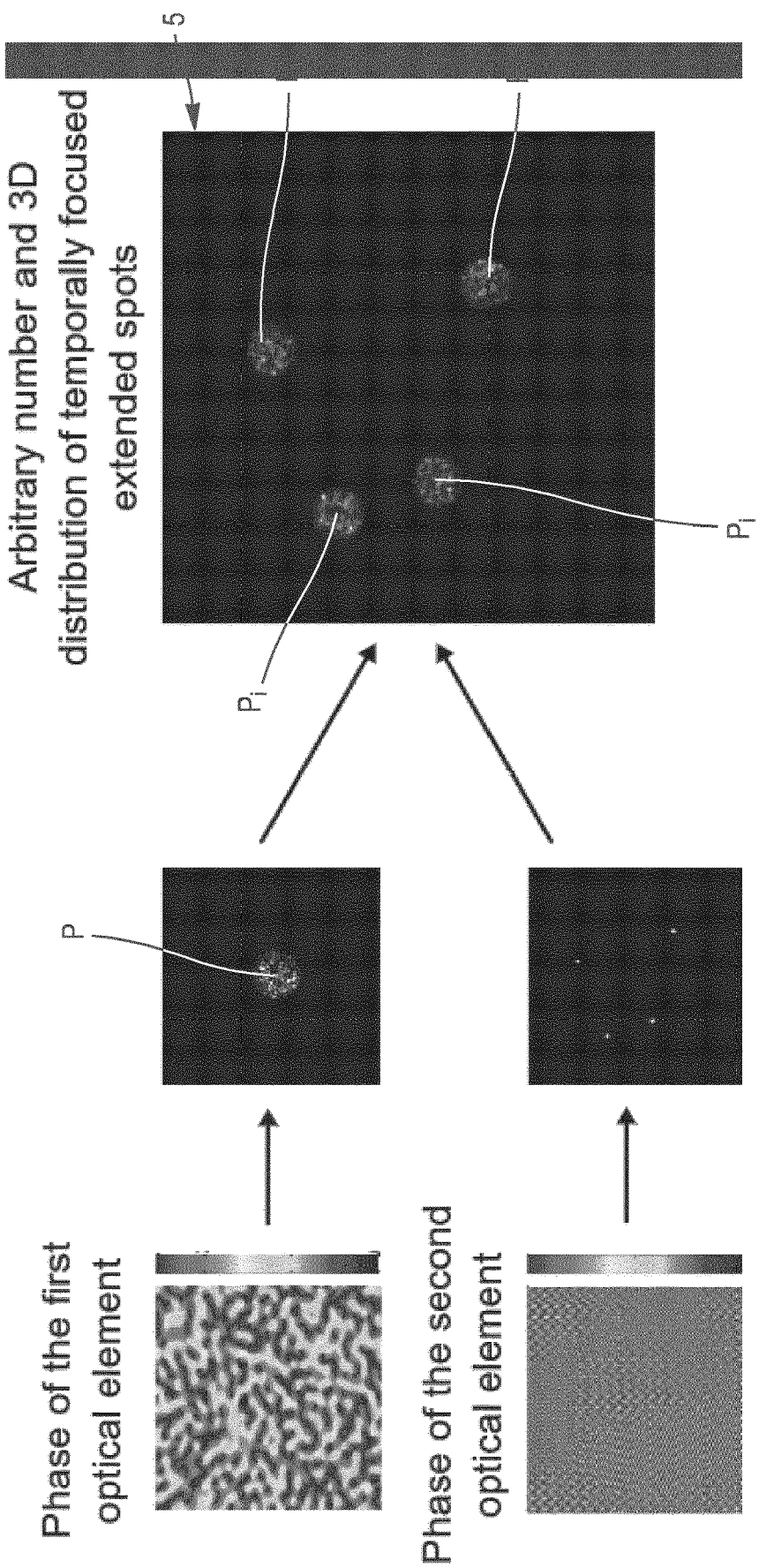

Variant B: Computer Generated Holography Via Reconfigurable Spatial Light Modulator The spatial shape of the incoming laser beam is obtained with Computer Generated Holography [1,2], based on spatially-controlled phase modulation of the laser wavefront via a LC-SLM. The screen of a LC-SLM is illuminated by the coherent light of a pulsed laser beam, properly enlarged by a beam-expander. A Fourier-transform based iterative algorithm calculates the necessary phase modulation that, when applied on the incident beam, produces the desired intensity pattern, which is then produced at the Fourier-conjugate plane of the LC-SLM. This configuration is represented in FIG. 1 and is the configuration used for the experimental demonstrations represented in FIGS. 3 and 4.

Variant C: Holographic Fixed-Phase Mask

The phase profile required to generate a specific pattern of interest (e.g. a circular spot of a given size) used in variant A, can also be imprinted on a fixed (static) phase mask. The phase mask can be realized via multistep fabrication processes (on quartz, polymers, etc.) and works either in reflection or transmission configuration. With respect to variant B, the optical scheme becomes simpler and more compact. This configuration is represented in FIG. 2.

Variant D: Generalized Phase Contrast Patterns

The spatial patterning of the input beam is obtained with the technique of Generalized Phase Contrast [3]. The phase of the incoming beam is modulated either by means of a LC-SLM or a fixed (static) phase mask and enters a common path interferometer. Generalized phase contrast allows efficient reproduction of homogeneous patterns, avoiding the characteristic inhomogeneities (speckles) of computer-generated holographic spots.

Variant E: Amplitude Modulation with Amplitude Mask or Digital Micromirror Device The input beam is shaped via an amplitude modulation obtained either by passing through an ad hoc amplitude mask or by reflecting off a Digital Micromirror Device.

An additional phase modulation could be coupled with an amplitude modulation approach (e.g. using a LC-SLM or an ad-hoc fixed phase mask) such that each pattern is encoded with a different phase-grating/prism effect and therefore is focused on a different and controllable lateral position on the active area of the second optical element 3, 3' (FIG. 5). This variant allows to better control the illumination of the active area of the optical element 3, 3' and gives the possibility to create different patterns in shape and size in different independent positions in the sample volume 5.

The illumination pattern P generated by the beam shaper is projected on a dispersive grating 4, 4', enabling the temporal focusing (TF) of the pattern in the target volume. In TF, the dispersive grating diffracts the different spectral frequencies that comprise the ultra-short excitation pulse, in different directions. The various frequencies thus propagate on different optical paths and at different angles, such that the laser pulse is temporally smeared above and below its focalization plane on the target volume, which remains the only region irradiated at peak powers efficient for any non-linear process, like, for instance, two-photon excitation in optical microscopy. TF thus allows reducing the dimension of the illumination pattern P along the optical axis (z) (see FIG. 4).

The third main element consists of a LC-SLM 3, 3' placed at the Fourier plane of the diffracting grating 4, 4'. It allows a user-defined phase modulation of the electric field to be applied on the incident beam. In particular, it is possible to displace the pattern generated by the beam shaper and dispersed by the grating 4, 4' in a specific xy-z target location on the far field of the second LC-SLM 3, 3', by addressing the second LC-SLM 3, 3' with a phase function that reproduces a grating/prism effect (FIGS. 3 and 4b), which determines a transversal $\Delta X\text{-}\Delta Y$ shift, or a lens effect (e.g. Fresnel lens), which determines an axial $\Delta Z$ shift.

Analogously, by addressing the second LC-SLM 3, 3' with a phase profile made up of multiple grating and lens effects [4,5], the illumination pattern P generated by the beam shaper will be multiplexed into several replicated illumination patterns of the original pattern P (see FIGS. 4c to 4f). In this case, the projection of the far field of the second LC-SLM 3, 3' on the target volume is composed of multi-site illumination patterns, optically confined both on lateral (x-y) and longitudinal (z) direction (see FIGS. 4c to 4f).

In the case of the beam shaper variant E, with coupled amplitude and phase modulation, the second LC-SLM 3, 3' is tiled in sub-regions, as in [6], corresponding to the regions in which the different patterns generated by the beam shaper are directed (FIG. 5). Each sub-region is addressed with a different phase profile made up of multiple grating and lens effects to independently control the position of the replicas of each pattern in the target volume 5.

Analogously, the optical system presented here can be combined with the optical system presented in [6] and in the PCT application WO2016/146279, for extending the performances of the PCT application WO2016/146279 for addressing bigger FOVs and excitation sample volumes 5, and the performances of the current application for projecting different patterns in different x, y, z positions. Thus, for instance, in the case of CGH both the first and the second optical elements (LC-SLMs) can be tiled in sub-regions, each sub-region of first LC-SLM 1 projecting a different pattern in the Fourier space, which, after being temporally-focused by the one intermediate optical element (diffraction grating used for TF) is replicated in different positions in the sample volume 5, by the phase profile made up of multiple grating and lens effects addressed to the corresponding sub-region of the second LC-SLM 3, 3'.

DISCUSSION

The only existing configuration for the generation of three-dimensional temporally-focused patterns is based on the use of two SLMs tiled in multiple sub-regions, each one encoding patterns addressing different z-positions [6].

This configuration sets a significant physical limit of the number of different z-positions (axial planes) addressable (practically, around 6), because of tiling of the SLM in one direction, that compromises patterns' quality. On the contrary, in the proposed novel configuration shaping of the beam and its lateral and axial displacement are performed separately by the beam shaper and the second LC-SLM 3, 3', respectively. This allows to optimize the use of the pixels of the second LC-SLM 3, 3', that here encodes solely lateral and axial position of the spots, and enables the generation of a number of spots and addressable z positions only limited by the total number of pixels and grey-levels of phase modulation of the second LC-SLM 3, 3', thus order of magnitudes higher than previous configurations. Moreover, simplified and more compact designs are readily available by implementing the variant A-C-D-E, based on Gaussian beams or static beam shapers.

The implementation of an initial beam shaper based on Generalized Phase Contrast interferometer (variant D) or on speckle-less computer generated holography algorithms [7], could equally enable the generation of multiple homogeneous illumination patterns $P_i$.

The wavelength dependence of existing SLMs results in a slightly different phase profile imprinted on the different colors (spectral frequencies) composing the pulsed laser beam. The diffraction grating used for temporal focusing spatially separates the colors, which therefore impinge on the second LC-SLM 3, 3' all at slightly different positions. The recombination of these colors in the target volume perturbs the spatiotemporal shape of the replicated illumination patterns $P_i$ that the SLM produces there, resulting in position dependent dispersion, axial position and confinement of the illumination patterns $P_i$. The optical system described here offers the unique possibility to correct for this effect and turn it to the user's advantage. By addressing each color separately at the second LC-SLM 3, 3' one can adjust the applied phase to compensate for the wavelength dependence of the device. This can be achieved by virtually dividing the second LC-SLM 3, 3' in different zones (corresponding to different colors), parallel to the orientation of the grooves of the diffraction grating, and applying a slightly corrected phase at each zone. The frequency resolution at the second LC-SLM 3, 3', which can be defined as the size of a single frequency (or color) component, defines the capability of the second LC-SLM 3, 3' to individually address different colors. A higher separation of the colors, which can be obtained for instance by choosing a diffraction grating with a higher density of grooves or a lens (L2 in FIG. 1) with a longer focal distance, increases the frequency resolution and therefore the capability of the system. Importantly, when using the system in this configuration, the user also obtains the unique possibility of creating pulses with different pre-defined temporal duration and shapes at different spatial positions. This can be achieved by applying to the second LC-SLM 3, 3' a phase that corresponds to a lateral shift of a diffraction-limited spot in the direction of the separation of the colors, plus a minor phase correction for different zones (colors) that varies linearly with the zone number. After calibrating the system, e.g. by measuring the time duration of the pulse for displaced illumination patterns $P_i$, the user will be able to generate the desired pulse length at the desired position.

Additionally, the second LC-SLM 3, 3' can be used to compensate for the optical aberrations introduced by optical elements placed after the grating 4, 4' or induced by propagation in scattering media.

A typical limitation in light patterning techniques is the lateral extension of the addressable target volume, (field of view—FOV). In the case of techniques based on diffractive approaches using SLMs, for example, this limit is related to a finite light-diffraction-efficiency of these devices, resulting in an upper limit in the lateral extension of the FOV or target volume. This lateral extension is typically defined as $$D_{max} = \lambda \frac{f}{d_{SLM}} * M,$$

where $\lambda$ is the laser wavelength, $f$ is the focal length of the first lens after the SLM, $d_{SLM}$ is the SLM's pixel size, and M is the magnification factor of the SLM plane projected at the back focal plane of the last lens of the system (the microscope objective in FIGS. 1 and 2). This novel configuration allows the use of the second SLM 3, 3' to further enlarge the lateral extension of the patterns initially produced by the beam shaper and therefore to increase the accessible field of view of the target volume. Specifically, the field of view FOV1 obtained only by the light patterning of the beam shaper, of extension $[\Delta x_1, \Delta y_1]$, is laterally extended up to $[\Delta x_1 + x_{max}, \Delta y_1 + x_{max}]$ (FOV2), with D the maximum deviation achievable by the second SLM 3, 3' (see FIG. 6).

Finally, by using an algorithm for the generation of extended holographic patterns (eg. Gerchberg-Saxton iterative algorithm) for the calculation of the phase mask of LC-SLM 3, 3', or by generating multiple replicas $P_i$ spatially close or partially superposed (see FIGS. 7a and 7b), or by tiling LC-SLM 3, 3' in sub-regions addressing light coming from different sub-regions of the beam shaper (using phase and/or amplitude modulation, see e.g. FIG. 5), the simultaneous generation of multiple spots of different sizes and shapes without any modification on the pattern generated by the beam shaper can be achieved.

Advantages of the Invention

One innovation of this optical system is the possibility to produce, at the sample position, a theoretically unlimited number of extended illumination shapes arranged in three dimensions (3Ds) with the superior axial resolution that temporal focusing (TF) provides. This is made possible by a two-step wavefront shaping, in which the first beam shaper (for several variants see the detailed description) creates the desired two-dimensional shape, while the second SLM, (placed at the Fourier plane of the diffraction grating for TF), replicates the original shape in an arbitrary three-dimensional arrangement. In this configuration, the second SLM applies to the laser beam an overall phase shift calculated as the sum of different lenses and gratings or prisms effects, each of which produces a diffraction-limited spot at the desired position in the 3Ds. At the sample volume, the combined effect of the two-step shaping is to replicate the original shape N times, while maintaining the TF effect. Very importantly, in this case, N is mainly limited by the performance of the second SLM in terms of diffraction-efficiency, which greatly increases (at least by one order of magnitude) the number of different planes that can be addressed at the sample volume, compared to previous optical strategies.

A further advantage of the present approach is the fact that the two-wavefront shaping steps are completely decoupled and independent one from the other. This means that all the limitations possibly introduced by the first beam shaping, do not affect or, to some extend can be even compensated, by the beam shaping effect set by the second SLM. Thus, all wavefront shaping techniques known to produce very homogeneous illumination targets at the expense of the available extension of the target volume (e.g. generalized phase contrast or speckle-free computer-generated holography) can highly benefit of the proposed optical scheme. Indeed, in the present case, thanks to the independence of the two-wavefront shaping steps, one could as well use one of such low-FOV techniques for the first step, as the second SLM would retrieve a large FOV at the sample volume, limited only by its own FOV (i.e., limited by its total number of pixels and the diffraction efficiency). In a similar way, the first SLM can be used for addressing a certain number of patterns in a certain lateral FOV, and the second SLM can be used to further expand this FOV with an extra grating/prism effect added on the phase profile.

Another innovation concerns the different domains that the second SLM can operate with. Because it is placed after the diffraction grating for TF, the second SLM has mixed access to both the spatial and the spectral phase (because the different wavelengths of the laser pulse are dispersed by the grating) of the laser beam. This, in turns, allows the user to control the spatial and the temporal shape of the illumination at the sample position in a unique way. Thus, regarding space, addressing the second SLM with a hologram for extended shapes (instead of diffraction-limited spots) changes the total size of the illumination target at the sample volume. This, for instance, gives the possibility to create different targets at different positions with different overall shapes. Regarding time (spectral domain), dividing the second SLM in wavelength regions and addressing them with dedicated holograms influences the temporal shape of an illumination targets. Creating different targets at different locations with different temporal shapes, therefore, becomes equally at reach.

REFERENCES

[1] Gerchberg R W and Saxton W O 1972 A practical algorithm for the determination of the phase from image and diffraction pictures *Optik (Stuttg).* 35 237-46
[2] Curtis J E, Koss B A and Grier D G 2002 Dynamic holographic optical tweezers. *Opt. Commun.* 207 169-75
[3] Glückstad J 1996 Phase contrast image synthesis Opt. Commun. 130 225-30
[4] Di Leonardo R, Ianni F and Ruocco G 2007 Computer generation of optimal holograms for optical trap arrays. *Opt. Express* 15 1913-22
[5] Yang S, Papagiakoumou E, Guillon M, de Sars V, Tang C M and Emiliani V 2011 Three-dimensional holographic photostimulation of the dendritic arbor *J. Neural Eng.* 8 46002

[6] Hernandez O, Papagiakoumou E, Tanesee D, Fidelin K, Wyart C and Emiliani V 2016 Three-dimensional spatiotemporal focusing of holographic patterns *Nat. Commun.* 7 11928

[7] Matar S, Golan L and Shoham S 2011 Reduction of two-photon holographic speckle using shift-averaging *Opt. Express* 19 25891-9

The invention claimed is:

1. Optical system for spatiotemporally shaping the wavefront of the electric field of a light beam (1, 1') to be projected into a target volume (5), where the propagation axis is axis z, to create 3D patterned illumination in the target volume (5), comprising:
   (i) a light emitting coherent pulsed source, coupled to a beam shaper, configured to give one initial illumination pattern (P) whose transversal surface in the target volume being superior to the diffraction limit of the optical system,
   (ii) at least one intermediate optical element (4, 4'), which is a dispersive grating for performing temporal focusing of the light beam (1, 1'), located, on the propagation axis (z), where an image of the illumination pattern (P) is formed,
   (iii) and a second optical element (3, 3') which is a spatial light modulator for modulating the phase of the electric field of the input light beam, and for realizing spatiotemporal multiplexing to create 3D patterned illumination in the target volume (5) by:
   replicating the initial illumination pattern (P), so as to have several replicated illumination patterns ($P_i$) in the target volume (5, 5'), each of the replicated illumination patterns ($P_i$) having a size at least equal to the size of the initial illumination pattern (P), and
   controlling the position of each replicated illumination pattern ($P_i$), given by the transversal coordinates $X_i$, $Y_i$ and axial coordinate $Z_i$ in the target volume (5, 5'),
   the coordinates $X_i$, $Y_i$ and $Z_i$ being chosen independently from each other,
   the second optical element (3, 3') being situated on the propagation axis z after the at least one intermediate optical element (4, 4') on the trajectory of the light beam (1, 1') at a Fourier plane,
   the second optical element (3, 3') being addressed with a phase function that reproduces a grating or prism effect for obtaining the transversal coordinates $X_i$, $Y_i$ of the replicated illumination pattern ($P_i$) in the target volume (5, 5'), and a lens effect for obtaining the axial coordinate $Z_i$ of the replicated illumination pattern ($P_i$).

2. Optical system according to the precedent claim 1, wherein the beam shaper is a first optical element (2) used to control light distribution, through phase and/or amplitude modulation of the electric field of the light beam, situated before the intermediate optical element (4) on the trajectory of the light beam (1), to generate the initial two-dimensional illumination pattern (P), described by a function $f(x,y,z=0)$, the initial illumination pattern (P) being imaged onto at least one intermediate optical element (4) via a first lens (L1) situated between the first optical element (2) and the intermediate optical element (4), and then replicated N times to have N replicated illumination patterns ($P_i$) in the target volume (5), at positions of coordinates $\Delta X_i$, $\Delta Y_i$, $\Delta Z_i$ such that the resulting illumination pattern which is composed by the N replicated illumination patterns ($P_i$) is given by a function $F(X,Y,Z)=\sum_{i=1}^{N}f(M \cdot x+\Delta X_i, M \cdot y+\Delta Y_i, \Delta Z_i)$, with M the magnification factor between the plane of the intermediate optical element (4) and the target volume (5).

3. Optical system according to claim 1, wherein the second optical element (3, 3') is situated at the Fourier plane of a lens (L2, L3'), situated between the intermediate optical element (4, 4') and the second optical element (3, 3'), and addressed with a phase function that reproduces a grating or prism effect for obtaining the transversal coordinates $X_i$, $Y_i$ of the replicated illumination pattern ($P_i$) in the target volume (5, 5'), and a lens effect for obtaining the axial coordinate $Z_i$ of the replicated illumination pattern ($P_i$).

4. Optical system according to claim 2, wherein the first optical element (2) is a static phase mask.

5. Optical system according to claim 2, wherein the first optical element (2) is a spatial light modulator (SLM) for creating an illumination pattern (P) with computer-generated holography.

6. Optical system according to precedent claim 5, wherein the computer-generated holographic pattern is a speckle-free pattern.

7. Optical system according to claim 2, wherein the first optical element (2) is a SLM for creating an illumination pattern (P) with the generalized phase contrast method.

8. Optical system according to claim 2, wherein the first optical element (2') is a static, or dynamically reconfigurable, amplitude-phase mask encoding several (n) illumination regions ($P^j$) for the initial illumination pattern (P), with different grating or prism phase effects, one grating or prism phase effect per region, for projecting the regions in different lateral (x,y) positions perpendicular to the propagation axis z, at an intermediate plane.

9. Optical system according to claim 1, wherein the second optical element (3') is a SLM configured in second sub-regions, each second sub-region addressing light arising from one single first sub-region of the initial illumination pattern (P) of the beam shaper described by a function $f(x,y,z=0)$, to perform phase modulation such as to replicate the shape of each first sub-region $N^j$ times to have $N^j$ replicated illumination patterns ($P_i^j$) in the target volume (5'), at positions of coordinates $\Delta X_i^j, \Delta Y_i^j, \Delta Z_i^j$ such that the resulting illumination pattern, which is composed by the $N^j$ replicated illumination patterns ($P_i^j$) is given by a function $F(X,Y,Z)=\sum_{j=1}^{n}\sum_{i=1}^{N^j}f_j(M \cdot x_j+\Delta X_i^j, M \cdot y_j+\Delta Y_i^j, \Delta Z_i^j)$, with M the magnification factor between the plane of the intermediate optical element (4') and the target volume (5'), where $f=f_1+f_2++f_j$.

10. Optical system according to claim 1, wherein the second optical element (3, 3') is configured to increase the size of the replicated illumination patterns ($P_i$) in the target volume (5, 5'), the size of each replicated illumination pattern ($P_i$) being increased independently.

11. Optical system according to claim 5, wherein the second optical element (3, 3') is configured to increase the field of view size of the transversal coordinates ($X_{FOV}$, $Y_{FOV}$) of the first SLM in the target volume (5, 5').

12. Optical system according to claim 1, wherein the second optical element (3) is configured to shape the light beam (1, 1') in the spectral domain, to correct for the intrinsic wavelength dependence of the SLMs, to produce dedicated holograms for different wavelengths, or to create different targets at different spatial locations in the target volume (5) characterized by different temporal shapes of the laser pulse.

13. Optical system according to claim 1, wherein the optical system comprises at least two intermediate optical elements (4, 4'), the first intermediate optical element being a digital micromirror device (DMD) for fast modification of the illumination pattern (P), and the second intermediate optical element being a dispersive grating for temporal focusing.

14. Optical system according to claim 1, wherein the second optical element (3, 3') is located at a back focal plane of a third lens (L2, L3'), which, together with a fourth lens (L3, L4'), form a telescope to image the plane of the second optical element (3) at the back focal plane of an objective lens (10).

15. Optical system according to the precedent claim 14, wherein the optical system comprises a graded-index lens after the objective lens.

16. Optical system according to claim 1, wherein the light emitting coherent pulsed source (A) is a pulsed laser source or a pulsed laser source with a beam expander.

17. Optical system according to the precedent claim 16, wherein the group velocity dispersion of the pulsed laser source is controlled to coincide the temporal focus with the respective spatial focus in the sample volume (5, 5') for every replicated pattern $P_i$.

* * * * *